United States Patent [19]
Komatsu

[11] Patent Number: 6,154,065
[45] Date of Patent: Nov. 28, 2000

[54] SENSE AMPLIFIER CIRCUIT

[75] Inventor: Koji Komatsu, Nara, Japan

[73] Assignee: Sharp Kabushiki Kaisha, Osaka, Japan

[21] Appl. No.: 09/174,370

[22] Filed: Oct. 15, 1998

[30] Foreign Application Priority Data

Nov. 28, 1997 [JP] Japan ................................ 9-327918

[51] Int. Cl.[7] ............... G11C 11/34; G01R 19/165; H03F 3/45
[52] U.S. Cl. ............... 327/56; 327/75; 365/185.21; 365/189.07; 341/135
[58] Field of Search .................. 327/52, 53, 56, 327/62, 74, 76, 104, 75; 365/168, 185.03, 185.21, 189.07, 207; 341/135

[56] References Cited

U.S. PATENT DOCUMENTS

| | | | |
|---|---|---|---|
| 4,574,276 | 3/1986 | Sato | 327/74 |
| 4,590,391 | 5/1986 | Valley | 327/74 |
| 5,532,627 | 7/1996 | Kearney et al. | 327/74 |
| 5,751,632 | 5/1998 | Choi et al. | 365/185.2 |
| 5,796,273 | 8/1998 | Jung et al. | 327/55 |
| 5,808,932 | 9/1998 | Irrinki et al. | 365/168 |
| 5,889,419 | 3/1999 | Fischer et al. | 327/62 |

FOREIGN PATENT DOCUMENTS 5-217385  8/1993  Japan ................. G11C 16/04

*Primary Examiner*—Timothy P. Callahan
*Assistant Examiner*—Terry L. Englund
*Attorney, Agent, or Firm*—Morrison & Foerster LLP

[57] ABSTRACT

A sense-amplifier circuit comprising a plurality of sub-sense-amplifiers corresponding to respective reference potentials can operate fast when used for a multivalued information memory. The sense amplifier circuit is composed of sub-sense-amplifiers having different polarities according to corresponding reference potentials: a sub-sense-amplifier SN3 having the highest reference potential is of N (polarity) type and a sub-sense-amplifier SP1 having the lowest reference potential is of P (polarity) type. All sub-sense-amplifiers can operate according to improved characteristics assuring a reduced access time.

15 Claims, 14 Drawing Sheets

| VBIT | SA1 | SA2 | SA3 | D1 | D2 |
|------|-----|-----|-----|----|----|
| VTH1 | 1 | 1 | 1 | 0 | 0 |
| VTH2 | 0 | 1 | 1 | 0 | 1 |
| VTH3 | 0 | 0 | 1 | 1 | 0 |
| VTH4 | 0 | 0 | 0 | 1 | 1 |

SENSE AMPLIFIER CIRCUIT

BACKGROUND OF THE INVENTION

The present invention relates to current-mirror-type sense-amplifier circuits that can be effectively applied in a multivalued-information memory for storing three or more values in each of its memory cells.

There has been proposed a multivalued-information memory capable of storing three or more values in each of its memory cells. This is realized in such a manner that plural threshold potential values are preset for each memory cell by changing an amount of impurities induced into channel areas of the memory cell for a mask ROM or by changing an amount of accumulating charge of floating gates for a flash $E^2$PROM. The discrimination of these threshold potentials is conducted by comparing each potential at each bit line with plural reference values corresponding to the threshold potential values of the memory cell.

In case of storing, e.g., four-value information in each memory cell with bit-line potentials corresponding to respective threshold potential values expressed as VTH1, VTH2, VTH3 and VTH4, the first reference potential value VREF1 is set at a certain value between the values VTH1 and VTH2, the second reference potential value VREF2 is set at a certain value between the values VTH2 and VTH3 and the third reference potential value VREF3 is set at a certain value between the values VTH3 and VTH4. The above reference values are used by sub sense-amplifiers SN1, SN2 and SN3 as shown in FIG. 1. A bit-line potential VBIT is one of the values VTH1, VTH2, VTH3 and VTH4 and, therefore, output signals SA1, SA2 and SA3 corresponding to the bit-line potentials are obtained. FIG. 2 shows a relationship between bit-line potentials and reference potentials. CE is a signal for activating a sense amplifier. Two bit-information (D1, D2 in FIG. 4) according to the above-described output signals SA1, SA2 and SA3 can be readout by a circuit of FIG. 3.

Japanese Laid-open Patent Publication No. 5-217385 discloses a sense amplifier circuit used for a mask ROM. In the disclosure, as shown in FIG. 5, the sense amplifier is applied for a mask ROM for storing four-valued information in each of memory cells, wherein four bit-line potentials VTH1, VTH2, VTH3 and VTH4 are used as reference potentials corresponding to respective thresholds of the memory cell. The amplifier circuit is provided with three sub sense-amplifiers SL1, SL2 and SL3 each of which consists of a current mirror circuit. The first sub sense-amplifier SL1 is given the first and second bit-line potentials VTH1 and VTH2 as reference potentials, the second sub sense-amplifier SL2 is given the second and third bit-line potentials VTH2 and VTH3 as reference potentials and the third sub sense-amplifier SL3 is given the third and fourth bit-line potentials VTH3 and VTH4. This enables the amplifier circuit to use reference bit-lines having the same construction as that of the corresponding bit-lines of the memory cell, thus realizing stable reading of the potentials.

Referring now to FIGS. 6 and 7, a current-mirror-type sense-amplifier will be described as below:

As seen in FIG. 6, the first static inverter is composed of a n-type metal-oxide silicon field-effect transistor MOSFET QN1 and a p-type MOSFET QP1 and the second static inverter is composed of a n-type MOSFET QN2 and a p-type MOSFET QP2: both the inverters are in parallel to each other and connected each at one end to a ground potential (GND) through a n-type MOSFET QN3. The static inverters are also connected each at the other end to a power-source potential (Vcc). With the signal CE for activating the sense-amplifier, the n-type MOSFET QN3 conducts bringing the sense-amplifier into the state being ready to work. The p-type MOSFET QP1 and QP2 compose a load side of the current mirror. The n-type MOSFET QN1 and QN2 are supplied with input potentials to be compared with each other. Namely, a reference potential VREF is input to a gate of the n-type MOSFET QN1 and a bit-line potential VBIT is fed to a gate of the n-type MOSFET QN2. A difference between those potentials is detected and output as an output signal VOUT.

In the first static inverter, the p-type MOSFET QP1 operating in the saturated mode (region) possesses a load characteristic curve (a1) and the n-type MOSFET QN1 possesses a drive characteristic curve (b1) as shown in FIG. 7. These curves (a1) and (b1) intersect at a point V1=A1. On the other hand, the p-type MOSFET QP2 of the second static inverter has a gate voltage V1 equal to that of the p-type MOSFET QP1 of the first inverter and has, therefore, a load characteristic curve (c1). With VREF=VBIT, the drive characteristic curve of the n-type MOSFET QN2 of the second static inverter becomes equal to b1. Both the characteristic curves intersect at a point of VOUT=A1. The drive characteristic of the n-type MOSFET QN2 of the second static inverter, since the curves b1 and c1 intersect in a saturated region, changes to the curves d1 and e1 with a small change in the bit-line potential. Therefore, the intersection of the curve b1 with the load characteristic curve c1 considerably shifts from the VOUT=B1 to a point of VOUT=C1. Thus, a small voltage signal can be sensed and amplified faster at high sensitivity as the characteristic I of FIG. 7.

Referring to FIG. 1, the operation of the amplifier circuit used in a multivalued memory will be described below.

In an initial state of the sense-amplifier circuit, bit-lines (VBIT) and reference-lines (VREF) are usually pre-charged to set at an initial potential V0 (FIG. 2) before reading-out operation. When a memory cell is then discharged, the bit-line potential (VBIT) reaches one of the bit-line potentials (VTH1, VTH2, VTH3, VTH4) depending on the threshold of the memory cell. On the other hand, the reference line potential takes an intermediate potential value (VREF1, VREF2, VREF3) of the respective bit-lines. For example, when a bit-line potential VBIT is equal to VTH2 according to the threshold of the memory cell to be read-out, VBIT at the sub sense-amplifier SN1 becomes higher than VREF1, VBIT at the sub sense-amplifier SN2 becomes lower than VREF2 and VBIT at the sub sense-amplifier SN3 becomes lower than VREF3. At this time, the sub sense-amplifiers SN1, SN2 and SN3 have output signals SA1=0, SA2=1 and SA3=1 respectively and an output information (D1, D2)=(0, 1) is obtained through a circuit shown in FIG. 3. Similarly, an output information as shown in FIG. 4 can be obtained when bit-line potentials are of VTH1, VTH3 and VTH4.

In the current-mirror-type sense-amplifier, the transition of its output SA becomes slower with a smaller difference between a bit-line potential and a reference potential. Accordingly, each sub sense-amplifier having a small difference ($\Delta V=|VBIT-VREF|$) between a bit-line potential and a reference potential may have a considerable delay time of transition, by which the delay time of the sense amplifier circuit is defined. Consequently, the sense amplifier circuit of FIG. 1 causes the memory to have an access time that is defined by SN1 with a least difference value ($\Delta V$) at the bit-line potential being equal to VTH1, by SN1 or SN2 at VTH2, by SN2 or SN3 at VTH3 and by SN3 at VTH4.

The sense-amplifier circuit used for a multivalued information memory is composed of a plurality of sub sense-amplifiers corresponding to respective reference potentials. If the sub sense-amplifiers are the same in construction, they have different sensitivity (gain) depending on the input potential signals irrespective of the same difference (ΔV). The gain characteristics of the sub sense-amplifiers are shown in FIG. 10.

In other words, the sense amplifier circuit may have an operating characteristic II shown in FIG. 8 at a higher reference potential, in which load and drive characteristic curves intersect at a point A2 outside the saturated region of the drive characteristic. Therefore, a change in bit-line potential VBIT causes the second static inverter to change the drive characteristic of its MOSFET QN2 into curves d2 and e2, resulting in that the intersection between the drive characteristic e2 and the load characteristic c2 is shifted from the point VOUT=B2 to the point VOUT=C2. Thus, the same change in the bit-line potential may cause |B2–C2|<|B1–C1| to reduce the gain (sensitivity) of the amplifier circuit. At the same time, a drain current increases because of the condition Id2>Id1.

On the other hand, the sense amplifier circuit may have an operating characteristic III (FIG. 9) at the lower reference potential, in which the load and drive characteristic curves intersect at a point A3 outside the saturated region of the drive characteristic. Therefore, a change in bit-line potential VBIT causes |B3–C3|<|B1–C1| and reduces the gain (sensitivity) of the amplifier circuit. In this case, a drain current is reduced because of Id3<Id1, resulting in increasing the delay time of the sub sense-amplifiers. Furthermore, n-type MOSFET cannot conduct while the reference potential is lower than its threshold potential (Vtn). This makes it impossible to obtain a correct output of the sense amplifier circuit.

To reduce the access time to the multivalued information memory, respective sub sense-amplifiers must operate according to the operating characteristic I or the like as shown in FIG. 7. This can be realized by decreasing the difference between the reference potentials of the sub sense-amplifiers. However, a small difference between the reference potentials makes it impossible to provide a large difference between the reference potential and the bit-line potential for each sub sense-amplifier. This results in an unwanted decrease in the sensitivity of the sense amplifier circuit.

The sense amplifier circuit for the multivalued information memory, which is composed of plural sub-sense-amplifiers, requires different periods for obtaining comparison results by the sub sense-amplifiers and, therefore, has a final operation rate determined by the latest time at which output of the latest sub sense-amplifier can be obtained. The latest sub-amplifier has the operating characteristic III shown in FIG. 9.

The present invention was made to solve the above-described problems of the conventional sense amplifiers.

In a memory constructed as shown in FIG. 11, potentials VBIT of bit-lines BL of the memory increase as corresponding threshold values for memory cells MC increase. In the sense amplifier circuit of FIG. 1, the reference potentials VREF1, VREF2 and VREF3 correspond to the memory cells having threshold values in the ascending order. The sub sense-amplifiers SN1, SN2 and SN3 have operating characteristics III, I and II respectively (FIG. 10). These sub-sense-amplifiers are called as n-type polarity sub sense-amplifiers (n-type sense amplifiers).

The sense-amplifier circuit constructed as shown in FIG. 12, in which all n-type MOSFETs are provided with reversed conducting channels, has the reference potentials VREF1, VREF2 and VREF3 corresponding to the memory cells having threshold values in the ascending order. In this case, the sub sense-amplifiers SP1, SP2 and SP3 have operating characteristics II, I and III respectively (see FIG. 10) just contrary to the n-type sense amplifiers. These sub sense-amplifiers are called as p-type polarity sub sense-amplifiers (p-type sense amplifiers).

Accordingly, a sub-sense-amplifier of the p-type polarity is used as a sub sense-amplifier corresponding to the reference potential VREF1 and a n-type (polarity) sub-sense-amplifier of the n-type polarity is used as a sub-sense-amplifier corresponding to the reference potential VREF3 to avoid the operating characteristic III. A sub-sense-amplifier corresponding to the reference potential VREF2 may be of any polarity (p- or n-polarity). Thus, all sub sense-amplifiers have either of the characteristics I and II realizing the reduction of the access time.

Accordingly, the present invention is directed to a sense-amplifier circuit comprising sub sense-amplifiers being different in polarity depending on reference potentials, which circuit is used as a sense-amplifier circuit including plural mirror-current-type sub-sense-amplifiers corresponding to plural reference potentials.

The present invention is also directed to a sense-amplifier circuit comprising plural current-mirror-type sub-sense-amplifiers, wherein the sub sense-amplifier having the highest reference potential is of the n-type polarity and the sub sense-amplifier having the lowest reference potential is of the p-type polarity.

The limitation of the operating current enables the sub-sense-amplifier having the operating characteristic II to operate at the same level of current and voltage as the sub-sense-amplifier having the operating characteristic I. In an n-type sense-amplifier shown in FIG. 6, a gate potential of a MOSFET QN3 is preset at a specified intermediate potential being lower than a sum of its source/drain voltage (Vsd) and threshold voltage (Vth) so that the MOSFET QN3 can operate in a saturated region in which it serves as a constant current source. The optimization of the intermediate potential can equalize the current value of the QN3 to that of the characteristic I and, thereby, can attain the equivalent sensitivity. Namely, the n-type sense-amplifier MOSFET QN3 can be given the operating characteristic IV similar to the characteristic I by providing it with current limiting means as shown in FIG. 13.

Referring now to FIG. 13, the operation of the sense amplifier having the operating characteristic IV will be described below in detail.

It is assumed that an n-type MOSFET QN3 composing a switching element has a drain potential Vs determined as a point at balance between VREF and VBIT by a specified control input Vx (i.e., a gate potential of the n-type MOSFET QN3). When the source/gate voltage Vsg of the n-type MOSFET QN1 and QN2 drops by Vs the sub sense-amplifiers have the operating characteristic IV shown in FIG. 13, which curve intersects with the curve a22 at a point V1=VOUT=A22 in the balanced state (VBIT=VEREF). This improves the sensitivity of the sense amplifier so that the output VOUT against a change in the bit-line potential from B2–C2 of FIG. 14 (the same as shown in FIG. 8) to B22–C22 of FIG. 13. The power consumption of the sense amplifier can be reduced from Id2 to Id1. The control input VX is desirable to meet the condition (source/gate voltage Vsg–threshold voltage Vth)<(source/drain voltage Vsd) allowing the n-type MOSFET QN3 to operate in the saturated region in which it serves as a stabilized current source. The above description on the n-type sense amplifier is also applied to the p-type sense amplifier.

The present invention as described above is directed to a sense-amplifier circuit that can faster read data from a multivalued information memory by means of adaptively designing the polarity and current values of respective sub-sense-amplifiers composing the sense-amplifier circuit.

SUMMARY OF THE INVENTION

It is an object of the present invention to provide a sense amplifier circuit comprising plural current-mirror type sub-sense-amplifiers that are different in polarity depending on corresponding reference potentials.

Another object of the present invention is to provide a sense amplifier circuit comprising plural comprising plural current-mirror type sub-sense-amplifiers, wherein a sub sense-amplifier having the highest reference potential is of n-type polarity and a sub sense-amplifier having the lowest reference potential is of p-type polarity.

Another object of the present invention is to provide a sense amplifier circuit used for a multivalued-information memory, wherein plural sub-sense-amplifiers composing the circuit are optimized in polarity and current values to attain an increased rate of reading information from the memory.

DESCRIPTION OF THE PREFERRED EMBODIMENTS

Figure 15:
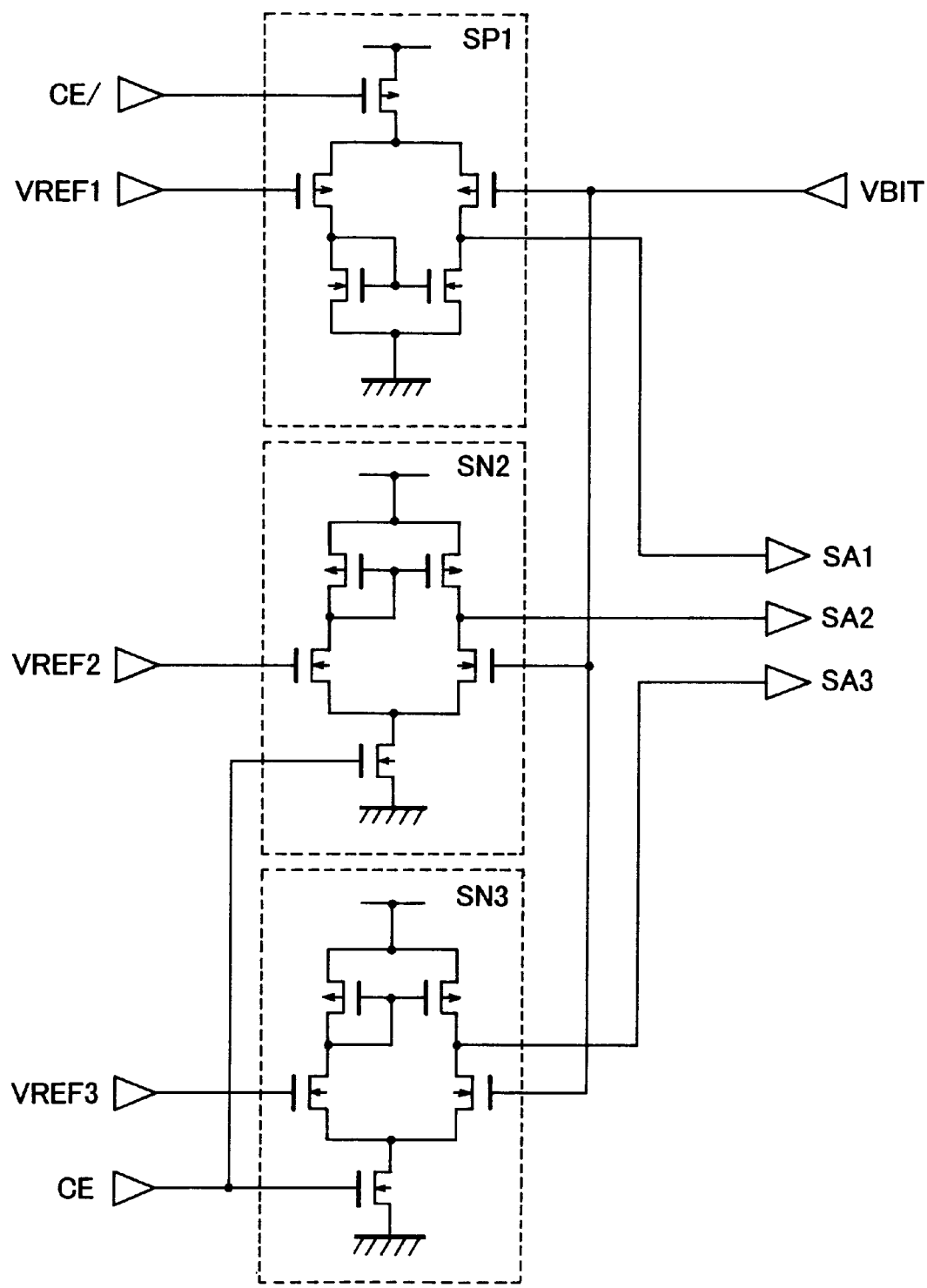
FIG. 15 is a circuit diagram showing a structure of a sense amplifier circuit according to a first embodiment of the present invention.

Referring to the accompanying drawings, preferred embodiments of the present invention will be described in detail as follows:

FIG. 15 is a circuit diagram of a sense amplifier circuit according to the first embodiment of the present invention, which circuit is used for a four-valued information memory as described before for the conventional sense amplifier circuit.

Figure 1:
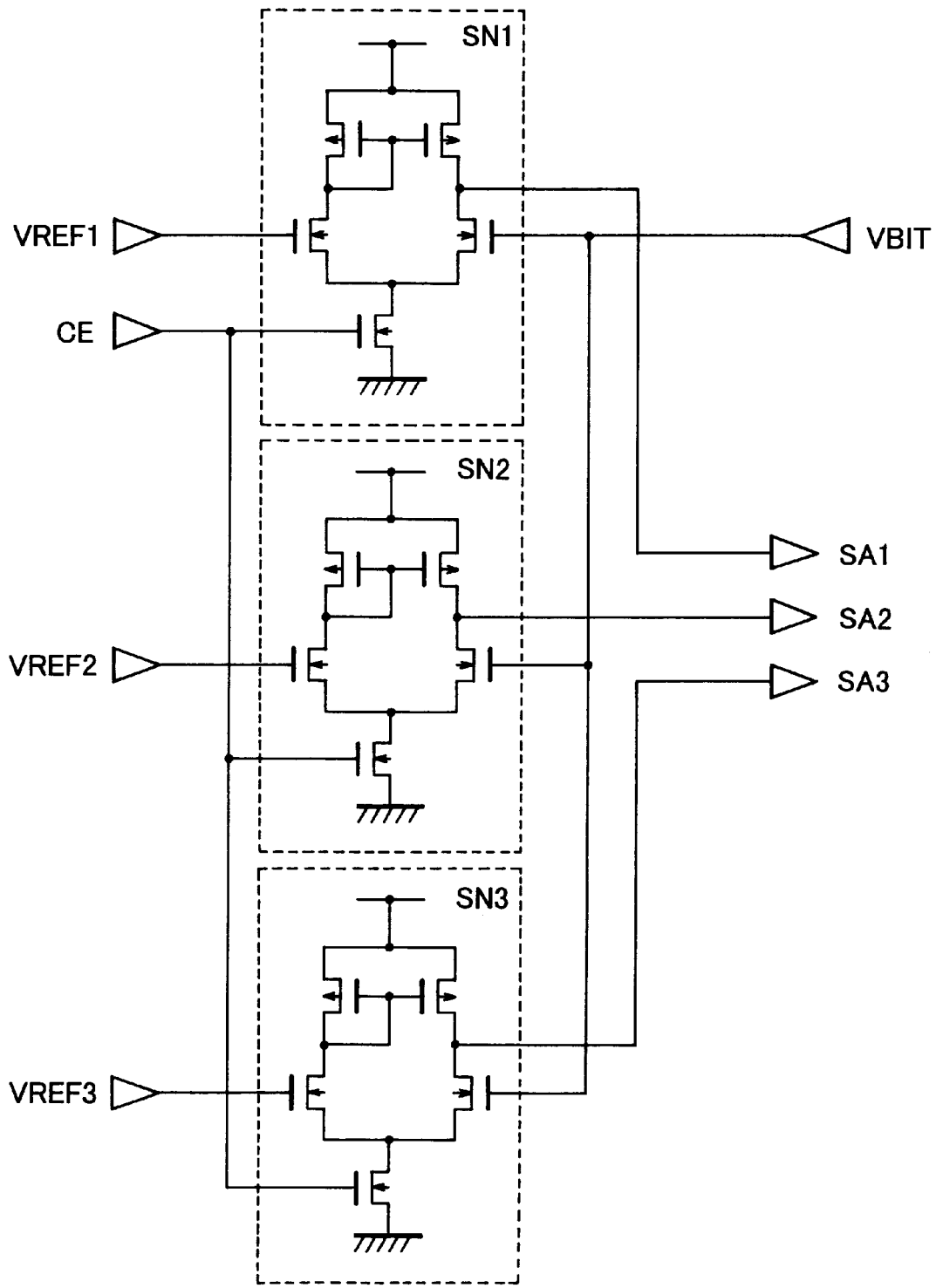
FIG. 1 is a circuit diagram showing a typical structure of a conventional sense amplifier circuit using n-type sub-sense-amplifiers.
Figure 2:
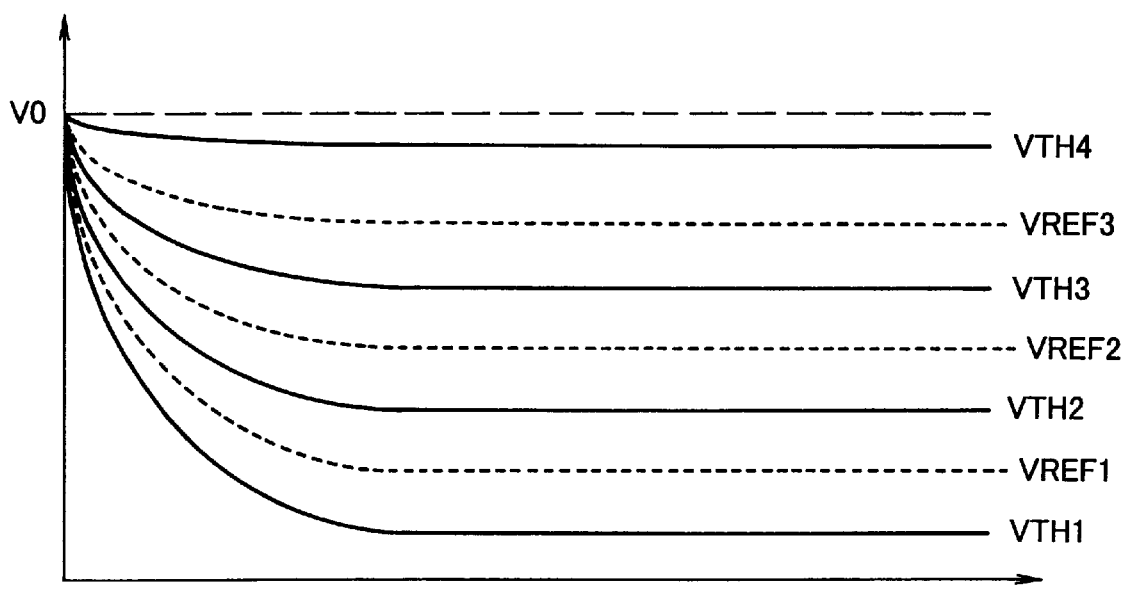
FIG. 2 is a graph for explaining a relationship between bit-line potentials and reference potentials.
Figures 3, 4:
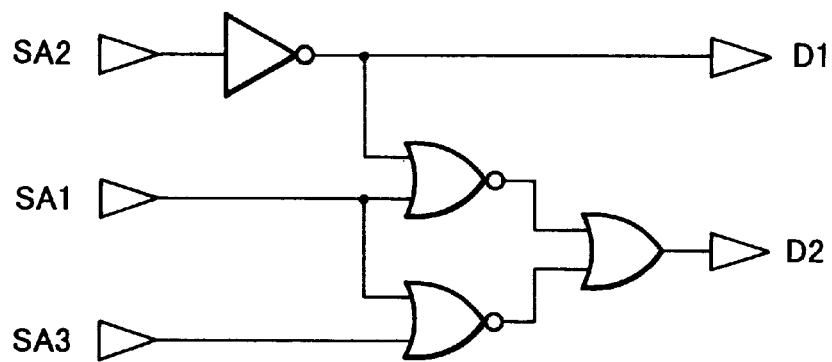
FIG. 3 is a circuit diagram showing an exemplified structure of an electric circuit for decoding a sense-amplifier output signal.
FIG. 4 is a table showing a relationship between bit-line potentials VBIT, sense-amplifier output signals SA and output information D.
Figure 5:
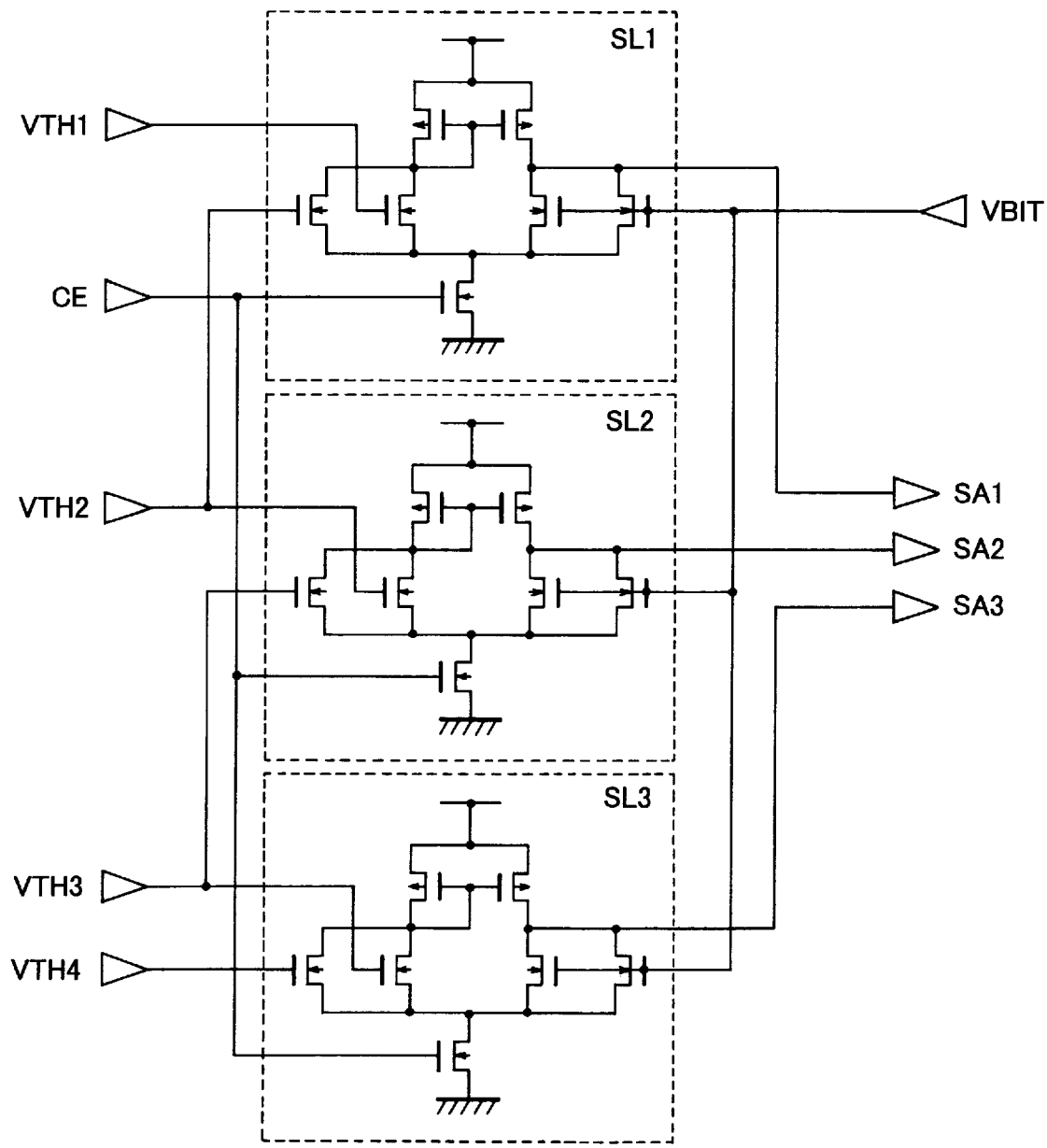
FIG. 5 is a circuit diagram showing a structure of a conventional sense amplifier circuit disclosed in Japanese Laid-open Patent Publication No. 5-217385.
Figure 6:
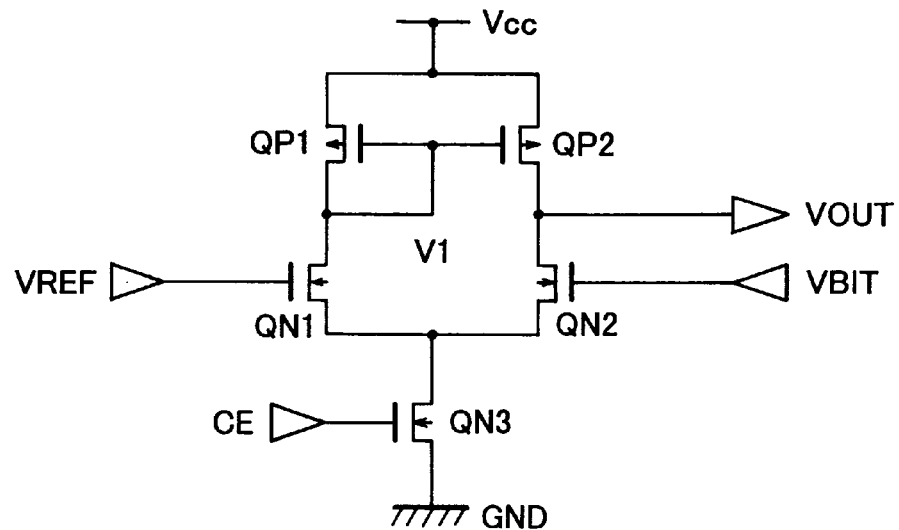
FIG. 6 is a circuit diagram showing an exemplified structure of an n-type sense amplifier.
Figure 7:
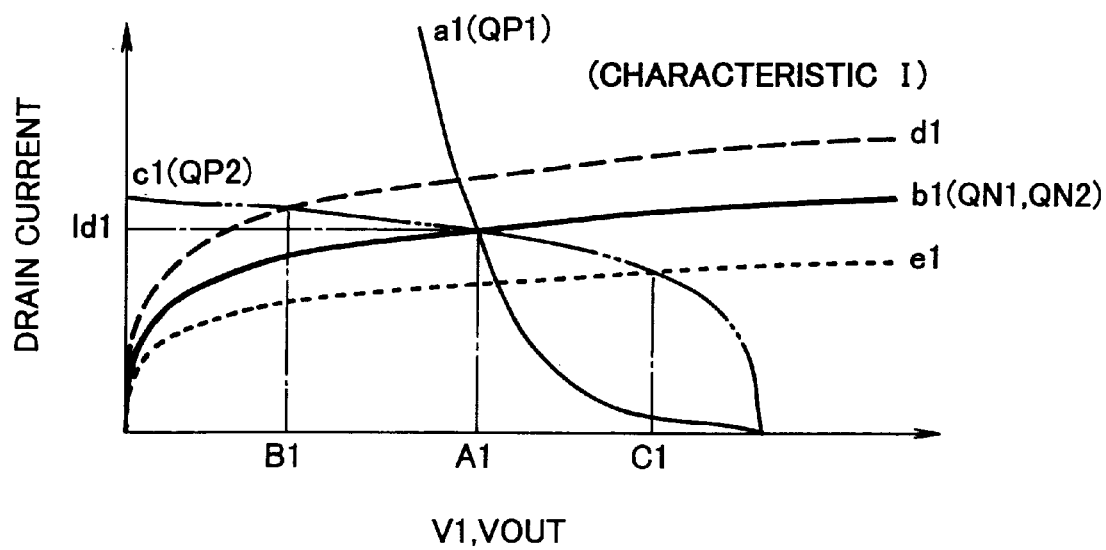
FIG. 7 shows characteristics of an n-type sense amplifier having a middle-level reference potential.
Figure 8:
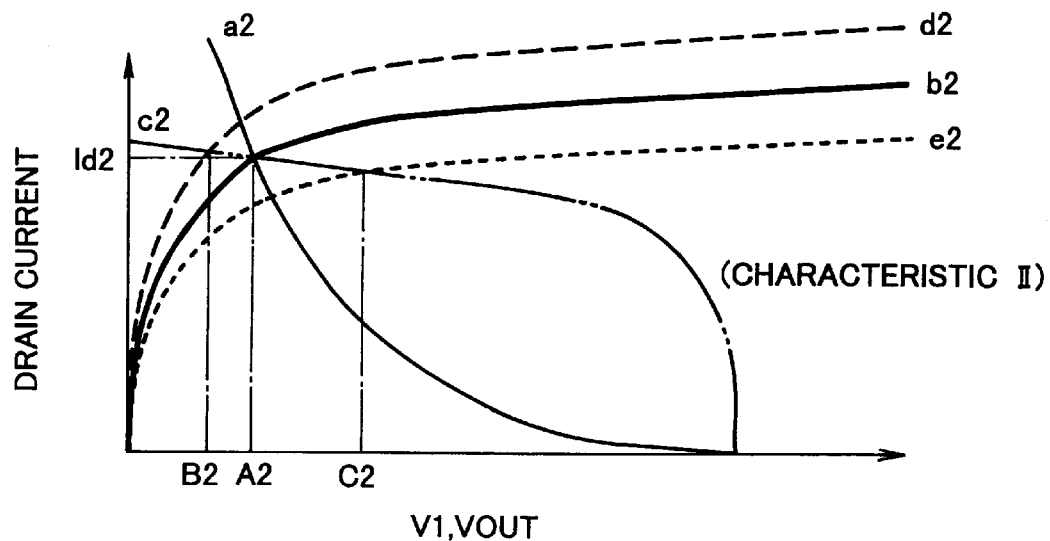
FIG. 8 shows characteristics of an n-type sense amplifier having a high-level reference potential.
Figure 9:
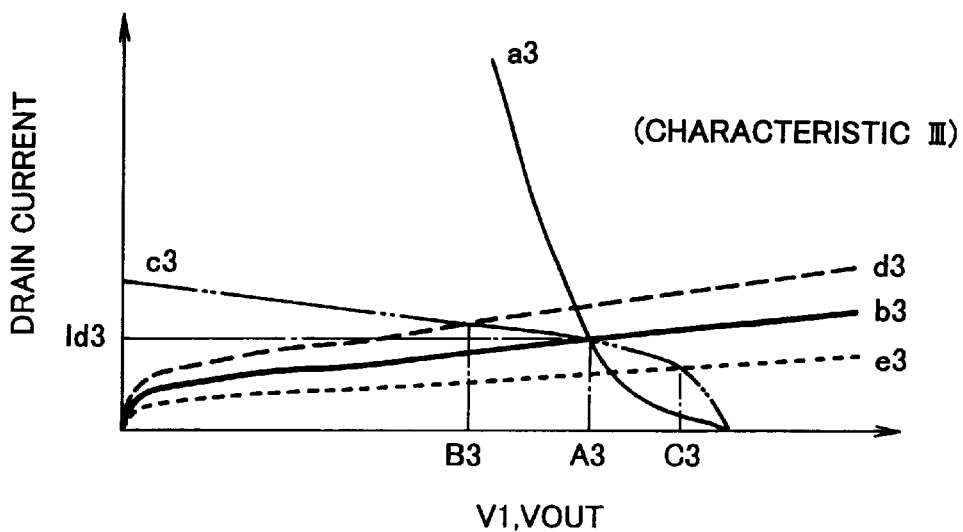
FIG. 9 shows characteristics of an n-type sense amplifier having a low-level reference potential.
Figure 10:
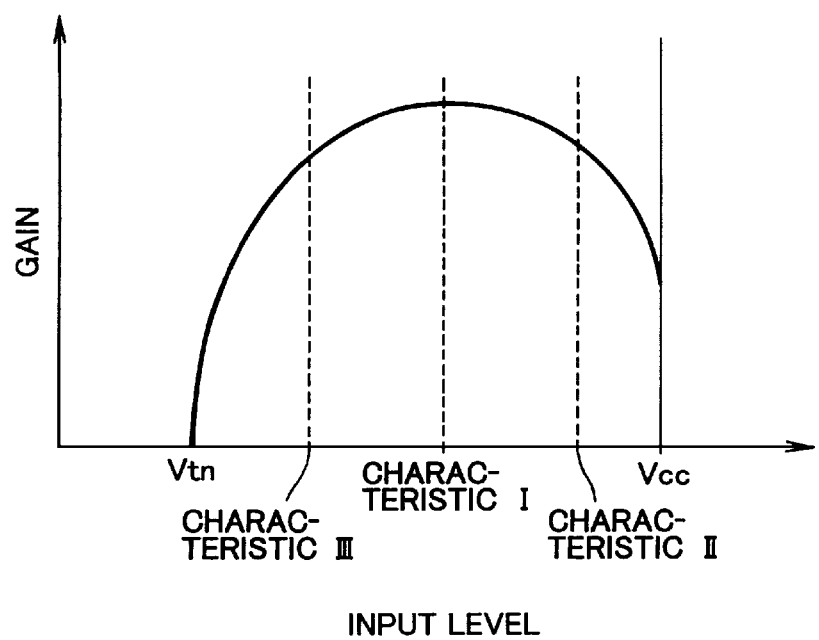
FIG. 10 is a graph showing a gain characteristic of an n-type sense amplifier.
Figure 11:
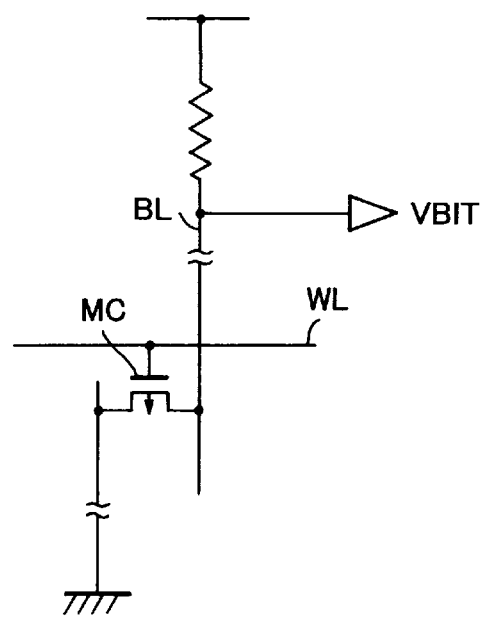
FIG. 11 is a circuit diagram showing an exemplified structure of a memory.
Figure 12:
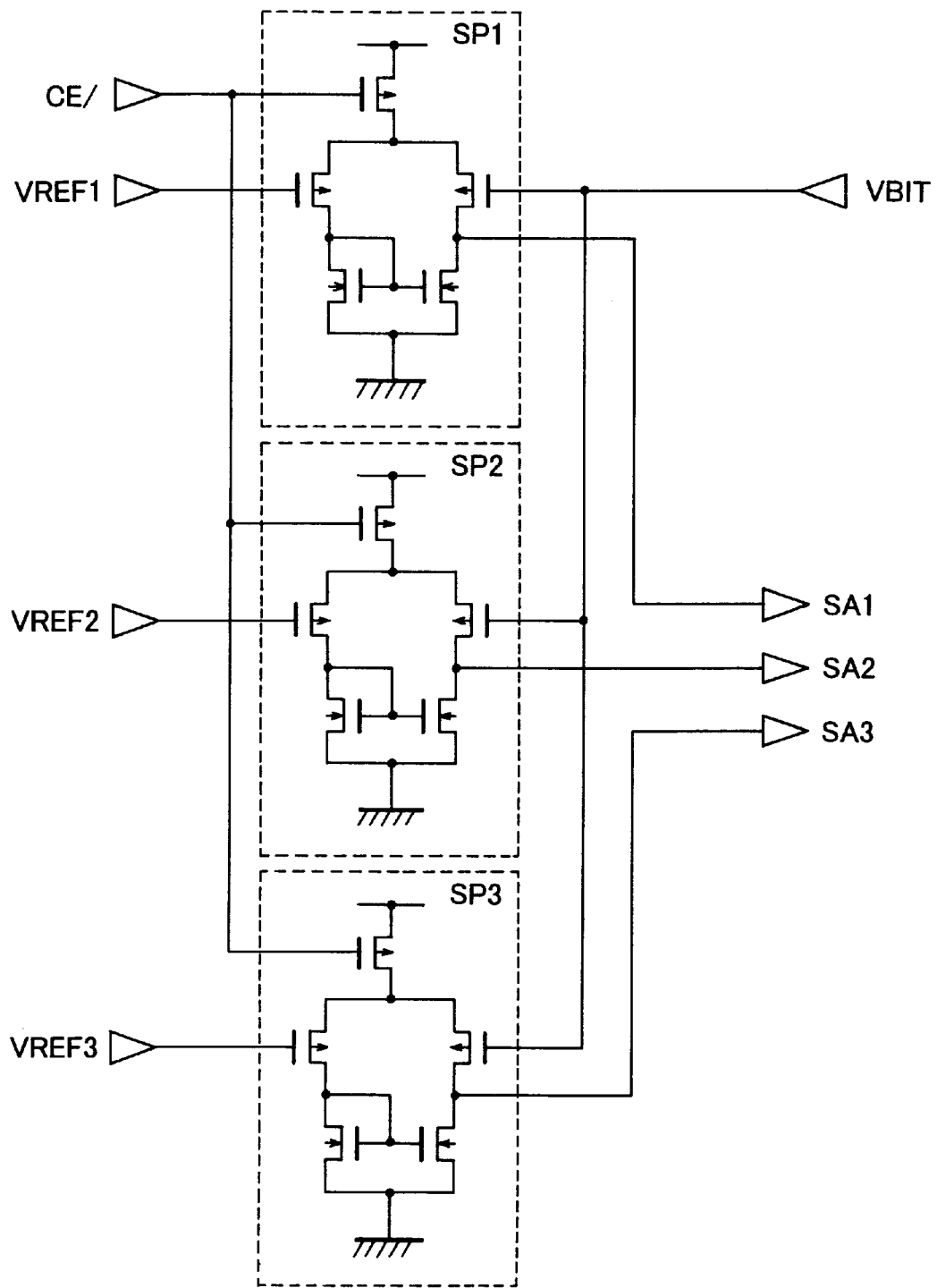
FIG. 12 is a circuit diagram showing a typical structure of a conventional sense amplifier circuit using p-type sub-sense-amplifiers.
Figure 13:
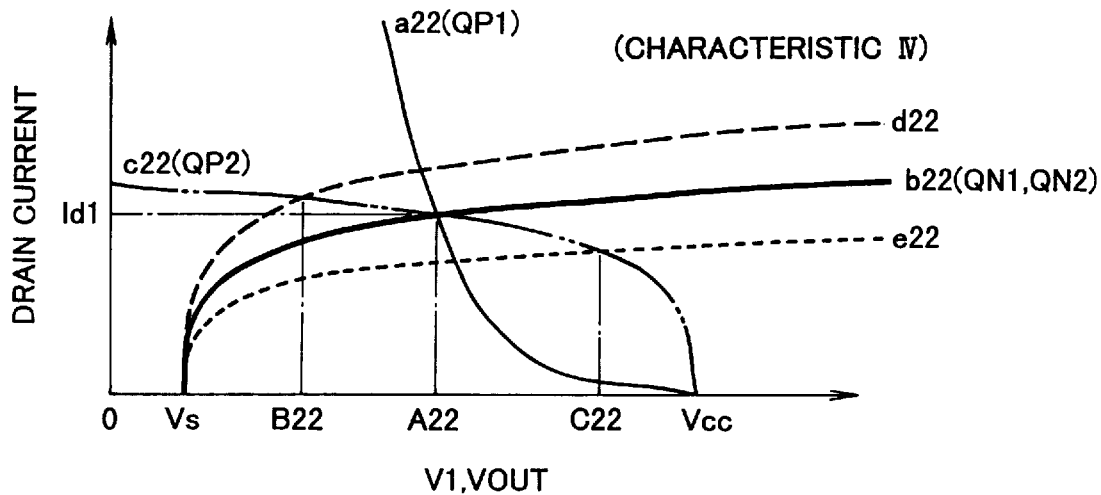
FIG. 13 is a graph showing a characteristic of an n-type sense amplifier provided with current limiting means.
Figure 14:
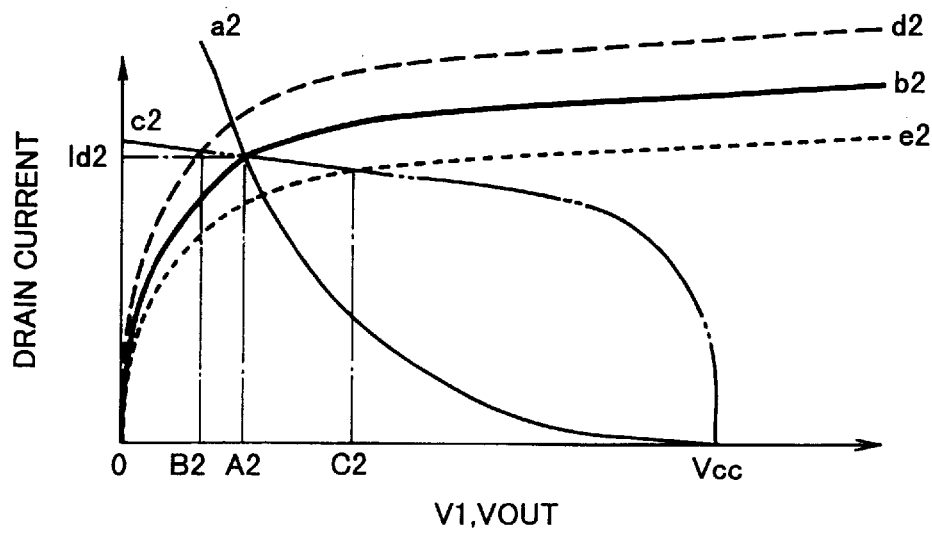
FIG. 14 is a graph of FIG. 8 for comparison with FIG. 13.

The sense amplifier circuit of FIG. 15 differs from the conventional circuit of FIG. 1 by the fact that a p-type sense amplifier SP1 is used as a sub-sense-amplifier corresponding to the lowest reference potential VREF1 and therefore a signal for activating the p-type sense amplifier SP1 is a signal CE with a bar. This enables respective sub-sense-amplifiers SP1, SN2 and SN3 to possess characteristics II, I and II (FIG. 10) respectively, whereby the sense amplifier circuit may attain an improved accessing time.

Thus, the sense amplifier circuit with known reference potentials for respective sub-sense-amplifiers can attain a reduced memory accessing time by adaptively disposing n-type and p-type sub-sense-amplifiers.

The n-type sub sense-amplifier SN2 corresponding to the second reference potential VREF2 of FIG. 15 may be replaced by the p-type sub sense-amplifier (SP2) in a certain case if the latter has a better characteristic in respect to the second reference potential VREF2.

A sense amplifier circuit according to the second embodiment of the present invention is described as follows:

The second embodiment is featured by the use of sub-sense-amplifiers which can change their polarity according to respective selecting signals. There may be a case that the adaptive polarity of each sub-sense-amplifier cannot be predetermined since bit-line potentials may vary with the threshold values of the corresponding memory cell due to the quality dispersions of the memories in the production process. In view of the above, the embodiment provides the possibility of setting signals for selecting the polarity of the respective sub-sense-amplifiers according to the results of testing the characteristics of the manufactured products. This selecting signal can be set by opening a laser fuse or inputting a signal through a specified terminal. The selecting signals may be fixed during the memory manufacturing process if the process has been enough stabilized. In this case, there is no need for testing of respective chips and setting the selecting signals.

Figure 16:
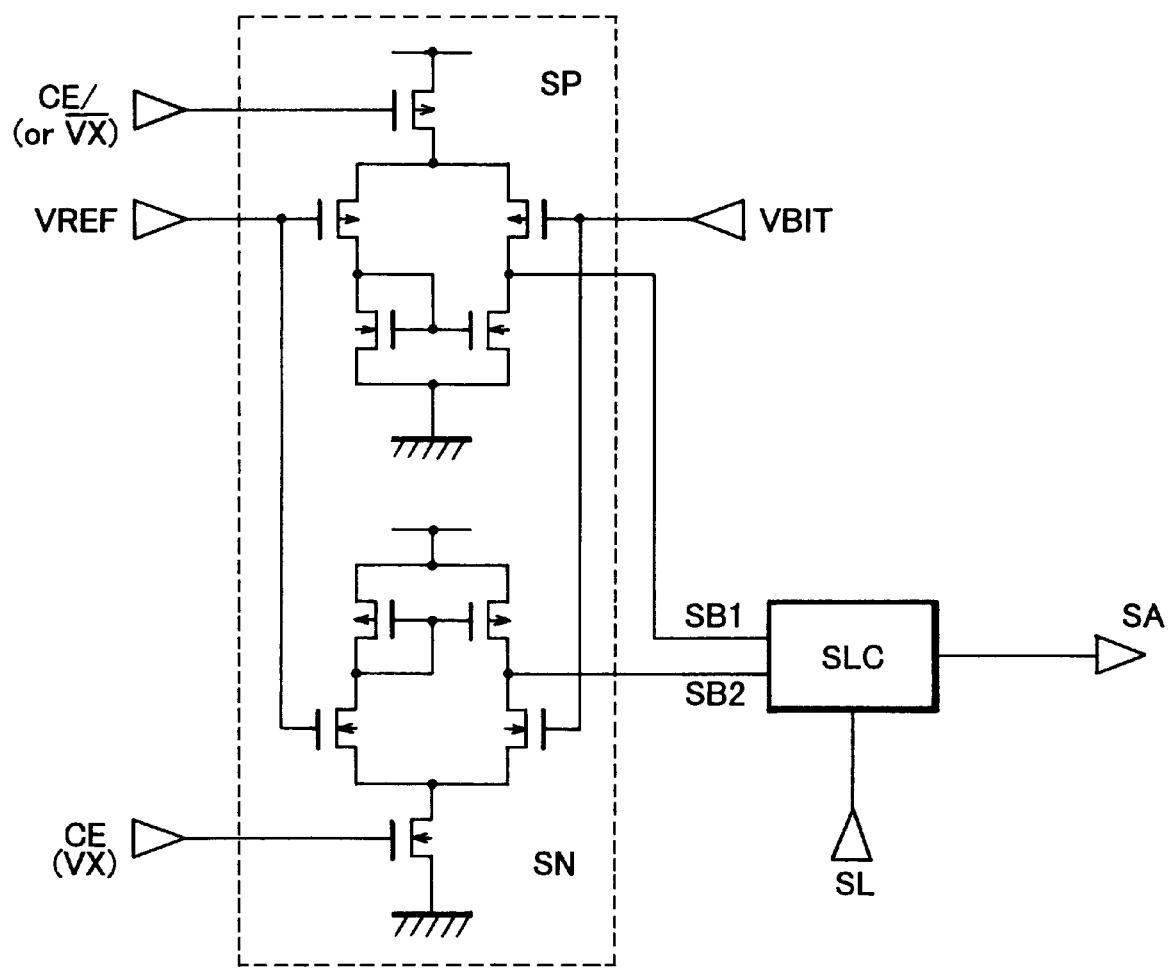
FIG. 16 is a circuit diagram showing an exemplified structure 1 of a polarity-changeable sense-amplifier used in a second embodiment of the present invention.
Figure 17:
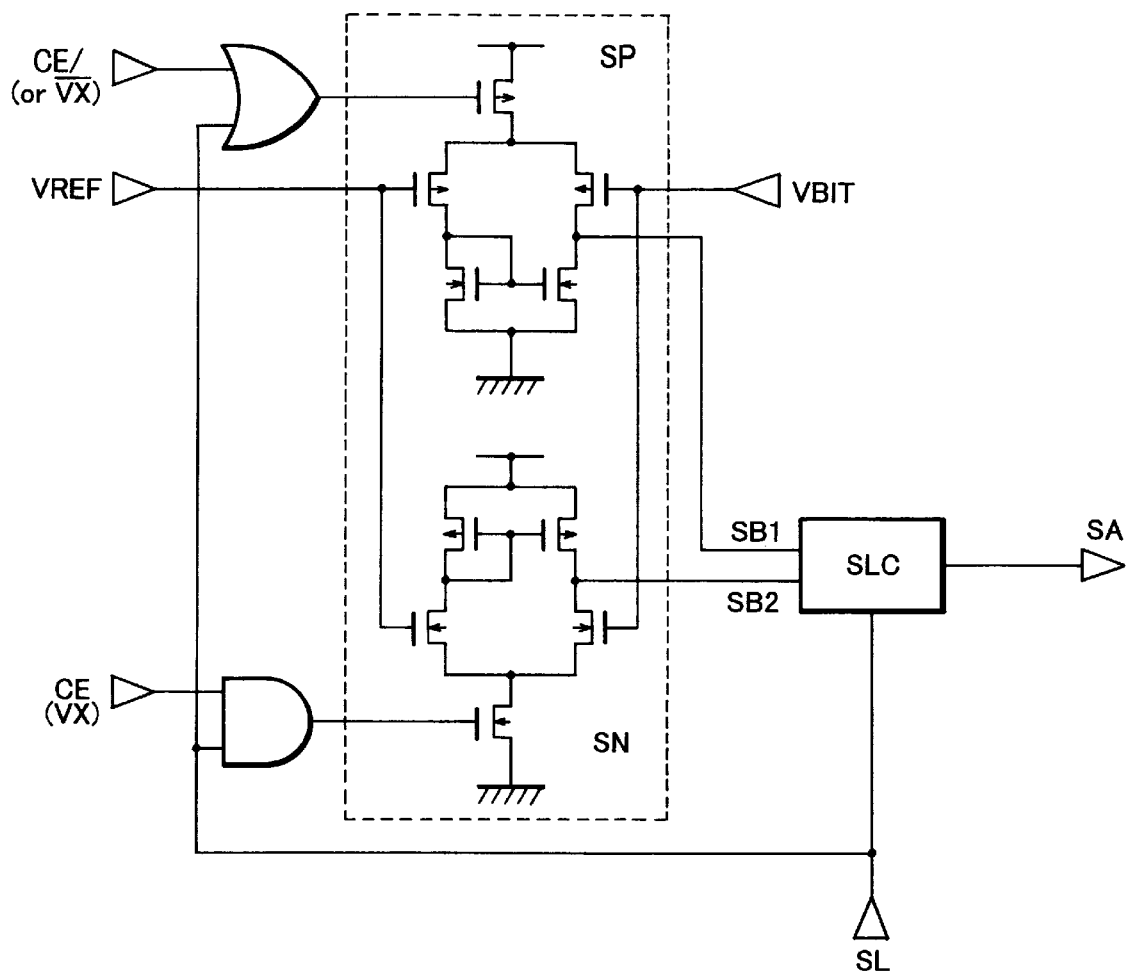
FIG. 17 is a circuit diagram showing an exemplified structure 2 of a polarity-changeable sense-amplifier used in a second embodiment of the present invention.

An exemplified construction of a sub sense-amplifier of the embodiment is shown in FIGS. 16 and 17.

Figure 18:
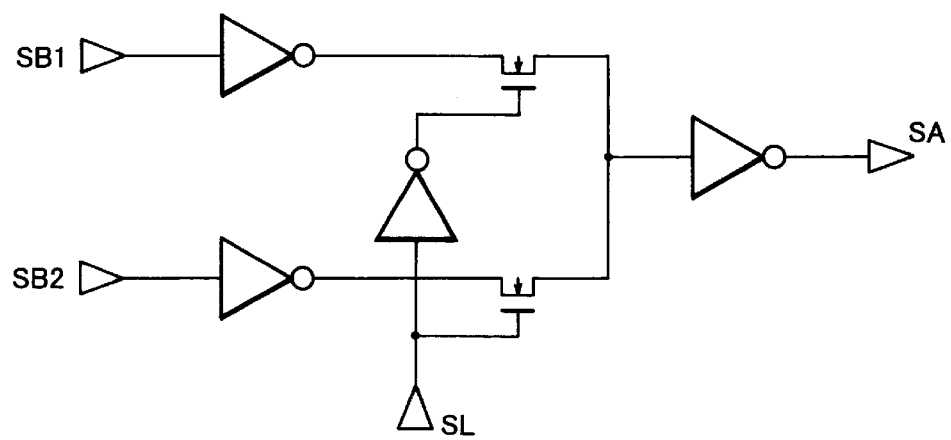
FIG. 18 is a circuit diagram showing an exemplified structure of a selecting circuit used in the polarity changeable sense amplifiers of FIGS. 16 and 17.

A selecting circuit SLC constructed as shown in FIG. 18 selects an output of an n-type sense amplifier SN by a selecting signal SL being at a level "H" and an output of a p-type sense amplifier SP by a selecting signal SL being at a level "L". Thus, the polarity of the sub-sense-amplifier can be changed by the selecting signal SL.

A selecting circuit SLC constructed as shown in FIG. 17 does not allow a not selected sense amplifier to conduct, whereby the power consumption can be saved accordingly as compared with the circuit construction of FIG. 16.

The above-described sub-sense-amplifier whose polarity is changeable can be used in place of the sub sense-amplifier SN2 corresponding to the second reference potential in the sense amplifier circuit shown in FIG. 15. It is also possible to compose the sense-amplifier circuit of the polarity-changeable sub-sense-amplifiers only.

A sense amplifier circuit according to the third embodiment of the present invention is described as follows:

The sense amplifier circuit according to the third embodiment is featured by a reduced current consumption and improved sensitivity, which is achieved by limiting current values for sub-sense-amplifiers having the operating characteristic II, i.e., those operating with the highest and lowest reference potentials. The sense amplifier circuit can thus attain a reduced access time.

The current limitation of the sub-sense-amplifiers can be realized by giving a specified medium potential to respective gates (QN3, QP3) of the amplifiers (MOSFET).

Figure 19:
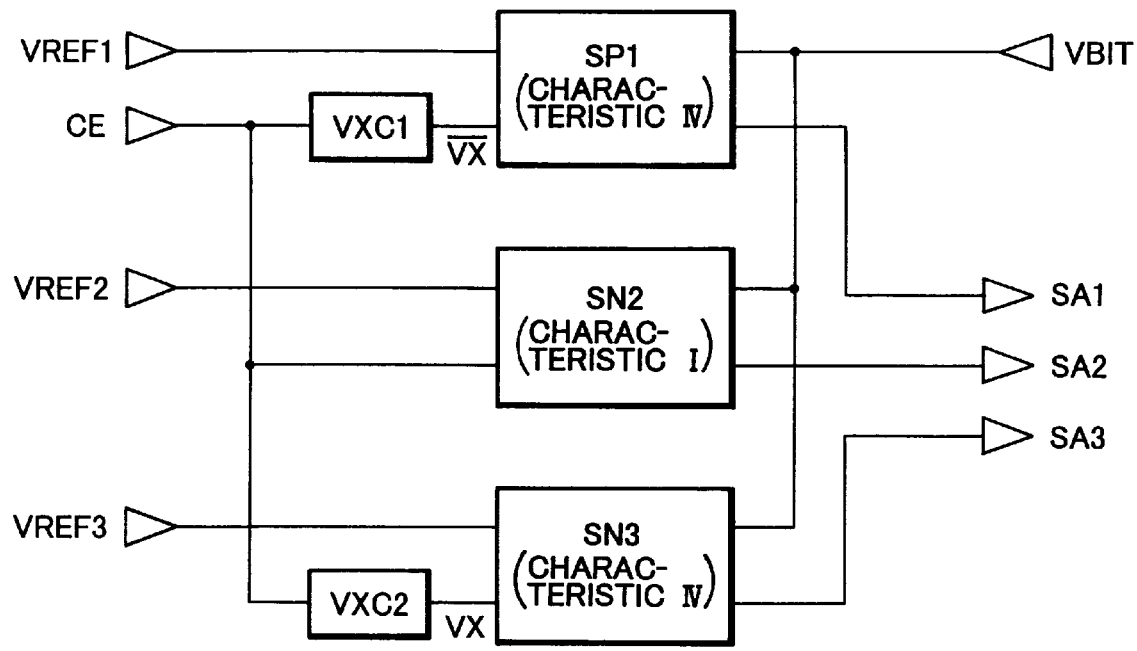
FIG. 19 is a block diagram of a sense amplifier circuit according to a third embodiment of the present invention.
Figure 20:
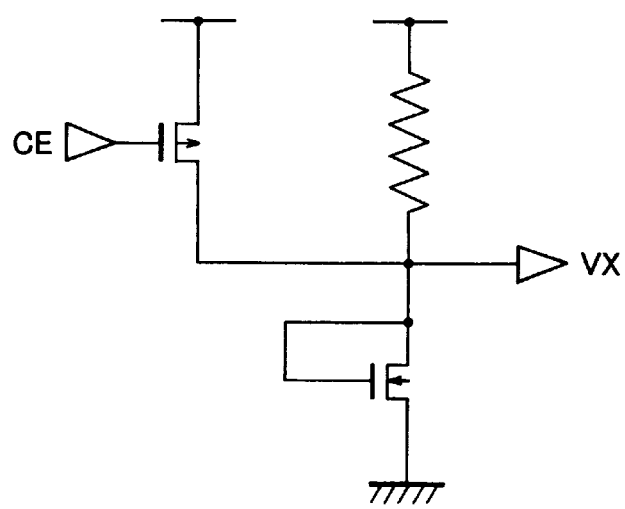
FIG. 20 is a circuit diagram showing an exemplified structure of a middle-level potential generating circuit VXC1 for a p-type sub-sense-amplifier used in the third embodiment of the present invention.
Figure 21:
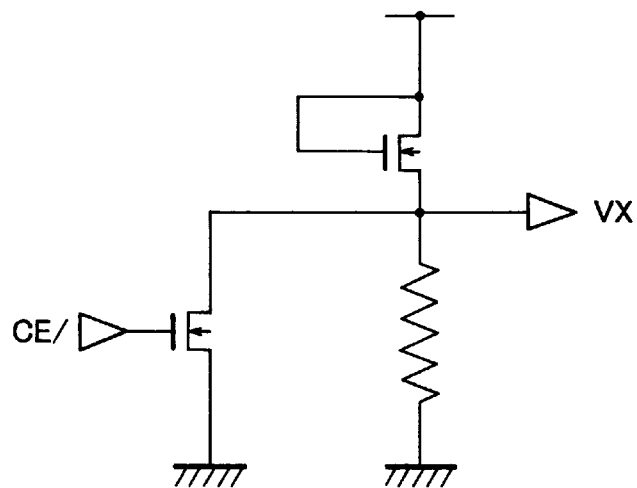
FIG. 21 is a circuit diagram showing an exemplified structure of a middle-level potential generating circuit VXC2 for an n-type sub-sense-amplifier used in the third embodiment of the present invention.

FIG. 19 shows a block diagram of the sense amplifier circuit according to the third embodiment, which circuit is featured by the provision of medium-potential generating circuits VXC1 and VXC2. The circuit VXC1 for generating a medium potential for a p-type sub-sense-amplifier SP1 may be, for example, constructed as shown in FIG. 20. The circuit VXC2 for generating a medium potential for an n-type sub-sense-amplifier SN3 may be, for example, constructed as shown in FIG. 21. With the medium potential, the corresponding sub-sense-amplifiers may have a current value equivalent to that obtained at the operating point of the characteristic I.

This embodiment may be used in combination with the second embodiment.

Finally, the fourth embodiment of the present invention is described below.

This embodiment is featured by simplified construction realized by limiting currents for all sub-sense-amplifiers to the substantially same level to attain the same level of high-speed accessing as the other embodiments have.

Figure 22:
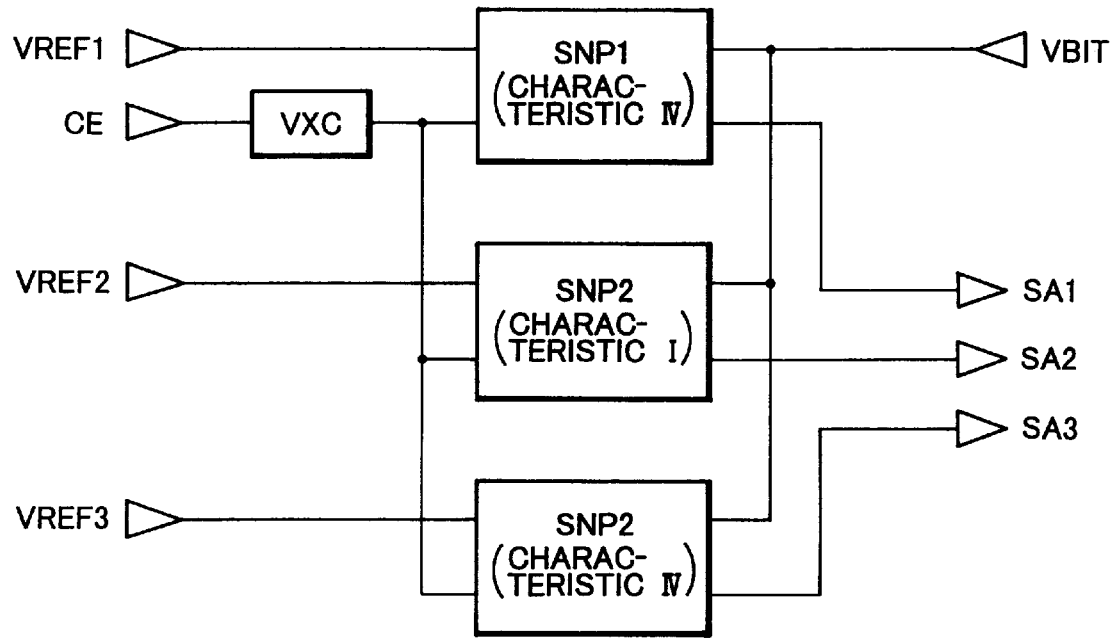
FIG. 22 is a block diagram of a sense amplifier circuit according to a fourth embodiment of the present invention.

A sense amplifier circuit of this embodiment is shown in FIG. 22. The circuit is featured by the provision of a medium-potential generating circuit VXC for generating a specified intermediate potential to be commonly applied to the respective sub-sense-amplifiers. This medium-potential generating circuit VXC may be of the type shown in FIG. 20 or in FIG. 21 for the third embodiment. The potential to be generated by the medium-potential generating circuit VXC is preset to a specified value at which the sub-sense-amplifiers SP1, SP2 and SP3 can be operated according to the characteristic I or IV.

It is also possible to use this embodiment in combination with the second embodiment.

While the present invention is described by way of example as the aspects used in four-value information memories, it can of-course be effectively applied to sense amplifier circuits to be used in five-value or more multivalued information memories.

The sense-amplifier circuits according to the present invention can have an improved speed of accessing to the multivalued information memories.

What is claimed is:

1. A sense amplifier circuit applied to a multivalued memory, the sense amplifier circuit comprising a plurality of current-mirror-type sub-sense-amplifiers corresponding to respective reference potentials, wherein each of the respective reference potentials is distinct from the others;

the sense amplifier circuit includes at least one sub-sense-amplifier having the polarity P, one sub-sense-amplifier having the polarity N, and at least one remaining sub-sense amplifier;

the sub-sense amplifier with the highest reference potential has the polarity N;

the sub-sense amplifier with the lowest reference potential has the polarity P; and the polarity of the at least one remaining sub-sense amplifier connected to its corresponding respective reference potential is determined to be the polarity P or the polarity N according to a specified selecting signal.

2. A sense amplifier circuit as defined in claim 1, further comprising a selecting circuit connected to the at least one remaining sub-sense-amplifier, wherein the at least one remaining sub-sense amplifier can change its polarity according to a selecting signal from the selecting circuit.

3. A sense amplifier circuit as defined in claim 1, wherein a current limiting means is provided for limiting a value of current for the sub-sense-amplifier having the highest or the lowest reference potential.

4. A sense amplifier circuit as defined in claim 1, wherein a current limiting means is provided for limiting current values of respective sub-sense-amplifiers to substantially the same level.

5. A sense amplifier circuit as defined in claim 2, wherein a current limiting means is provided for limiting a value of current for the sub-sense-amplifier having the highest or the lowest reference potential.

6. A sense amplifier circuit as defined in claim 2, wherein a current limiting means is provided for limiting current values of respective sub-sense-amplifiers to substantially the same level.

7. The sense amplifier circuit as defined in claim 1, wherein the sub-sense amplifier with the highest reference potential and the sub-sense-amplifier with the lowest reference potential are variable sub-sense-amplifiers set to have the polarity N or the polarity P, respectively according to the specified selecting signal.

8. The sense amplifier circuit as defined in claim 1, further comprising a selecting circuit which determines the polarity of each of the sub-sense-amplifiers.

9. The sense amplifier circuit as defined in claim 1, further comprising a selecting circuit for controlling current in each of the sub-sense-amplifiers.

10. The sense amplifier circuit as defined in claim 1, wherein the specified selecting signal is set by opening a laser fuse or inputting a signal through a specified terminal.

11. The sense amplifier circuit as defined in claim 1, further comprising a decoding circuit for decoding output signals from each of the sub-sense-amplifiers.

12. The sense amplifier circuit as defined in claim 3, further comprising a medium-potential generating circuit for generating an intermediate potential to control the current limiting means.

13. The sense amplifier circuit as defined in claim 4, further comprising a medium potential generating circuit for generating an intermediate potential to control the current limiting means.

14. The sense amplifier circuit as defined in claim 5, further comprising a medium potential generating circuit for generating an intermediate potential to control the current limiting means.

15. The sense amplifier circuit as defined in claim 6, further comprising a medium potential generating circuit for generating an intermediate potential to control the current limiting means.

* * * * *